(12) United States Patent
Lee et al.

(10) Patent No.: US 9,728,408 B2
(45) Date of Patent: Aug. 8, 2017

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Chung-Ju Lee, Hsinchu (TW); Chih-Tsung Shih, Hsinchu (TW); Jeng-Horng Chen, Hsin-Chu (TW); Shinn-Sheng Yu, Hsinchu (TW); Tsung-Min Huang, Taichung (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 15/017,808

(22) Filed: Feb. 8, 2016

(65) Prior Publication Data
US 2016/0172196 A1 Jun. 16, 2016

Related U.S. Application Data

(63) Continuation of application No. 14/268,130, filed on May 2, 2014, now Pat. No. 9,257,282.

(51) Int. Cl.
| | |
|---|---|
| *H01L 21/033* | (2006.01) |
| *H01L 21/311* | (2006.01) |
| *H01L 21/02* | (2006.01) |
| *H01L 21/768* | (2006.01) |

(52) U.S. Cl.
CPC ...... *H01L 21/0338* (2013.01); *H01L 21/0228* (2013.01); *H01L 21/0335* (2013.01); *H01L 21/0337* (2013.01); *H01L 21/31111* (2013.01); *H01L 21/31133* (2013.01); *H01L 21/31144* (2013.01); *H01L 21/76811* (2013.01); *H01L 21/76813* (2013.01); *H01L 2221/1021* (2013.01)

(58) Field of Classification Search
CPC .................................................. H01L 21/76808
See application file for complete search history.

(56) References Cited

U.S. PATENT DOCUMENTS

| | | | |
|---|---|---|---|
| 5,230,772 | A | 7/1993 | Kadomura |
| 7,404,167 | B2 | 7/2008 | Chuang |
| 7,611,980 | B2 | 11/2009 | Wells et al. |
| 7,989,341 | B2 | 8/2011 | Tseng |
| 8,415,089 | B1 | 4/2013 | Gupta et al. |
| 9,065,001 | B2 | 6/2015 | Jiang |
| 9,081,312 | B2 | 7/2015 | Lu |

(Continued)

*Primary Examiner* — Caleb Henry
*Assistant Examiner* — Mounir Amer
(74) *Attorney, Agent, or Firm* — Haynes and Boone, LLP

(57) ABSTRACT

A method of fabricating a semiconductor integrated circuit (IC) is disclosed. A dielectric layer is formed over a substrate. An interlayer is formed over the dielectric layer. A first photoresist layer with a first opening is formed over the interlayer and a second photoresist layer having a second opening is formed over the first photoresist layer. Spacers are formed along sidewalls of the first opening and the second opening. A first trench is formed in the interlayer by using the spacer along the first opening as an etch mask. A second trench is formed in the interlayer by using the spacer along the second opening as an etch mask. The first trench and the second trench are extended down into the dielectric layer as a lower portion and an upper portion, respectively, of a dielectric trench.

20 Claims, 10 Drawing Sheets

(56) References Cited

U.S. PATENT DOCUMENTS

| | | |
|---|---|---|
| 9,129,967 B2 | 9/2015 | Tsai |
| 2009/0219496 A1 | 9/2009 | Kamm et al. |
| 2010/0297851 A1 | 11/2010 | Bae et al. |
| 2013/0178068 A1 | 7/2013 | Yen et al. |

METHOD OF SEMICONDUCTOR INTEGRATED CIRCUIT FABRICATION

This is a continuation of U.S. Ser. No. 14/268,130 filed May 2, 2014. This is also related to U.S. Ser. No. 13/906,795 filed on May 14, 2013. The entire disclosures of both are hereby incorporated by reference.

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, a feasible method of forming small critical dimension features, such as trenches and fins, is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
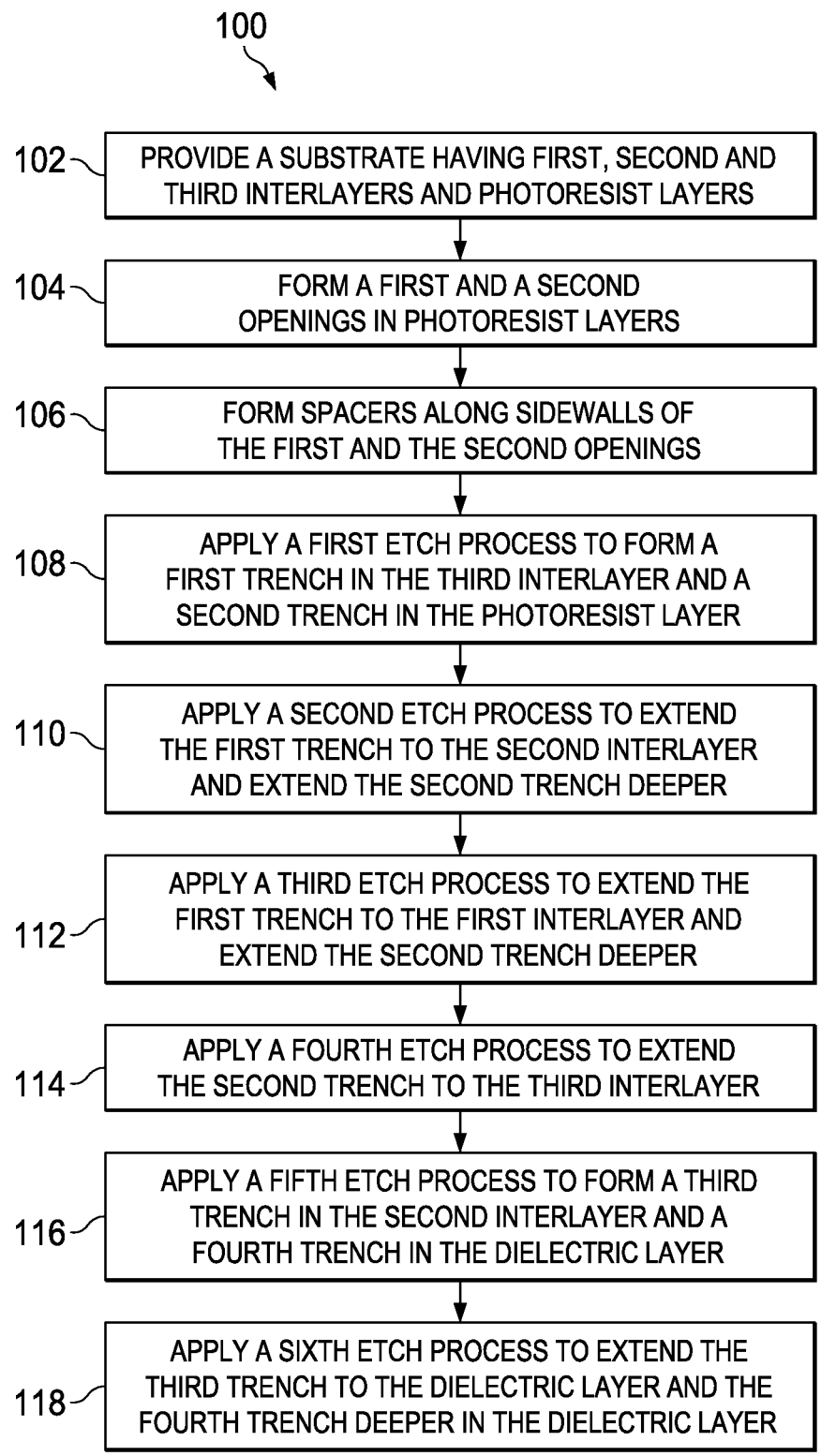
FIG. 1 is a flowchart of an example method for fabricating a semiconductor integrated circuit (IC) constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more IC devices in accordance with some embodiments. The method 100 is discussed in detail below, with reference to an IC device 200, shown in FIGS. 2 to 10, for the sake of example.

Figure 2:
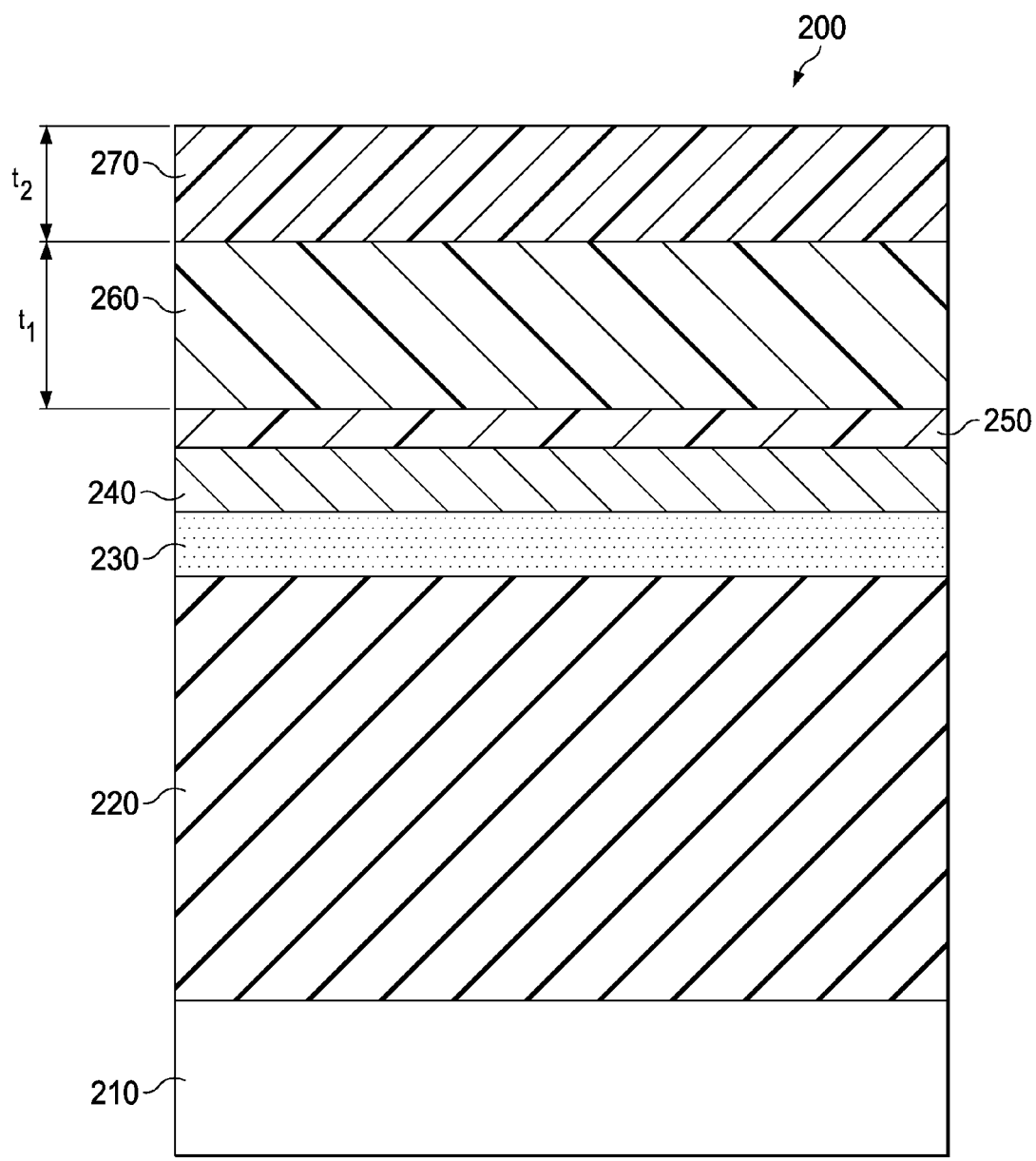
FIGS. 2 to 10 are cross sectional views of an example IC device constructed at fabrication stages in accordance with the method of FIG. 1.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable Still referring to FIG. 2 includes a dielectric layer 220 formed over the substrate 210. The dielectric layer 220 includes silicon oxide, low k (LK) dielectric material, other suitable dielectric material or combination thereof. In one embodiment, the dielectric layer 220 includes a LK dielectric material having a thickness of about 1200 Å.

Still referring to FIG. 2, in the present embodiment, various interlayers are formed over the dielectric layer 220. A first interlayer 230 is formed over the dielectric layer 220. The first interlayer 230 includes a suitable material for anti-reflection. In one embodiment, the first interlayer 230 includes a non-fluorine-containing anti-reflection material. The first interlayer 230 may include a material which is different from the dielectric layer 220 to achieve etching selectivity during subsequent etch processes. In one embodiment, the first interlayer 230 has a thickness of about 200 Å.

A second interlayer 240 is formed over the first interlayer 230. The second interlayer 240 may include a material which is different from the first interlayer 230 to achieve etching selectivity during subsequent etch processes. For example, the second interlayer 240 may include titanium oxide, titanium nitride, tantalum oxide, tantalum nitride, or any suitable materials. In one embodiment, the second interlayer 240 includes titanium nitride and has a thickness of about 200 Å.

A third interlayer 250 is formed over the second interlayer 240. The third interlayer 250 may include a material which is different from the second interlayer 240 and the first interlayer 230 to achieve etching selectivity during subsequent etch processes. In one embodiment, the third interlayer 250 includes a middle layer, such as a silicon-rich anti-reflection layer, having a thickness of about 100 Å.

The various above interlayers, as well as the dielectric layer 220, may be deposited by a suitable technique, such as spin-on coating, chemical vapor deposition (CVD), physical vapor deposition (PVD), atomic layer deposition (ALD), or other suitable technique.

Two photoresist layers are subsequently formed on the third interlayer 250. Specifically, a first photoresist layer 260 is formed over the third interlayer 250. The first photoresist layer 260 is formed by spin-on coating or other suitable technique. A second photoresist layer 270 is formed over the first photoresist layer 260. The second photoresist layer 270 is formed by spin-on coating or other suitable technique. Other steps, such as baking, may follow the coating of each photoresist layer. The first and second photoresist layers, 260 and 270, may have similar or different compositions from each other, according to various embodiments.

In one embodiment, the second photoresist layer 270 is different from the first photoresist layer 260. The first and second photoresist layers, 260 and 270, are configured to be exclusively dissolved in separate, respective developers. Specifically, a first developer is used to develop the first photoresist layer 260 and a second developer is used to develop the second photoresist layer 270. The first developer is different from the second developer. The first photoresist layer is dissoluble in the first developer but indissoluble in the second developer. The second photoresist layer 270 is dissoluble in the second developer but indissoluble in the first developer. In another embodiment, the first and second photoresist layers, 260 and 270, are chosen to have different exposure thresholds. In yet another embodiment, the second photoresist layer 270 attenuates the exposing beam during the lithography exposure process such that the exposing beam projected on the second photoresist layer 270 is partially absorbed and only a portion of the exposing beam reaches the first photoresist layer 260. Thus the exposing intensities to the first and second photoresist.

The first photoresist layer 260 and second photoresist layer 270 have a first thickness $t_1$ and a second thickness $t_2$, respectively. The first thicknesses $t_1$ and the second thickness $t_2$ are designed to provide adequate thicknesses for subsequent etch steps, which will be described in the following description.

Figure 3:
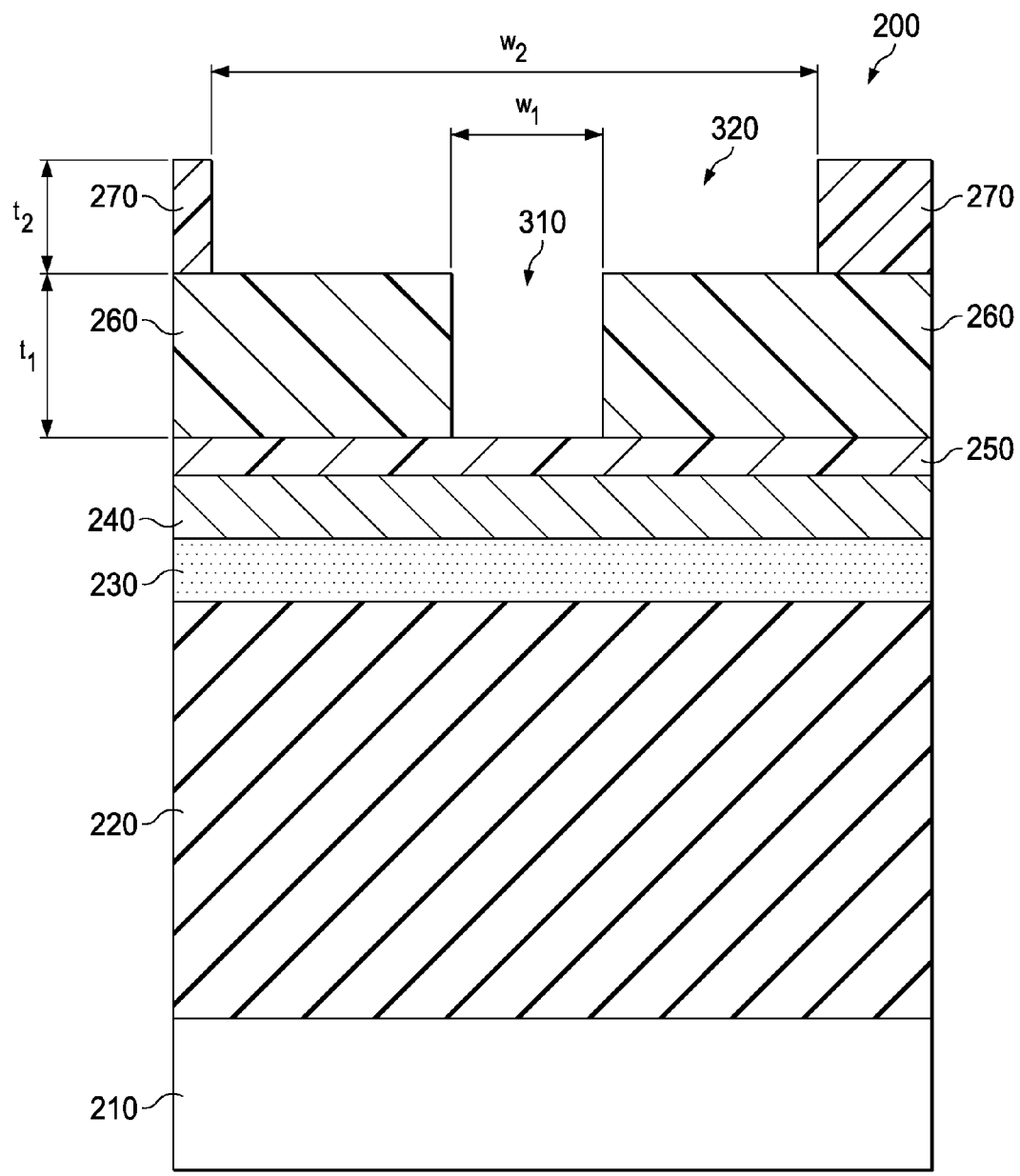

Referring to FIGS. 1 and 3, the method 100 proceeds to step 104 by forming a first opening 310 in the first photoresist layer 260 and a second opening 320 in the second photoresist layer 270, which connects to the first opening 310. The first opening 310 is formed to have a first width $w_1$ and the second opening 320 is formed to have a second width $w_2$, which is substantial larger than the first $w_1$. The first opening 310 is aligned within the second opening 320. In the present embodiment, a single lithography exposure process is implemented using a photomask to simultaneously expose both of the first and second photoresist layers, 260 and 270, thereby forming latent patterns on respective photoresist layers. During the lithography exposure process, a first latent pattern is formed in the first photoresist layer 260 and a second latent pattern is formed in the second photoresist layer 270. A latent pattern is referred to as a portion of the photoresist layer that is exposed but not developed yet. The first and second latent patterns are different from each other due to different exposing intensities, different exposure thresholds or both. In the present example, the first latent pattern is associated with the first opening 310 and the second latent pattern is associated with the second opening 320.

The second photoresist layer 270 is then developed by the corresponding developer. In the present embodiment, both the first and second photoresist layers are positive tone. The exposed portion in the second photoresist layer 270 is removed in the developer, thereby forming a patterned second photoresist layer having the second opening 320. The first photoresist layer 260 is then developed by the corresponding developer. The exposed portion is removed in the developer, thereby forming a patterned second photoresist layer having the first opening 310.

The method of forming two patterns simultaneously in two different photoresist layers is described in the patent application U.S. Ser. No. 13/906,795 filed on May 14, 2013, as "Method to define multiple layer patterns using a single exposure", the entire disclosure of which is hereby incorporated by reference.

Figure 4:
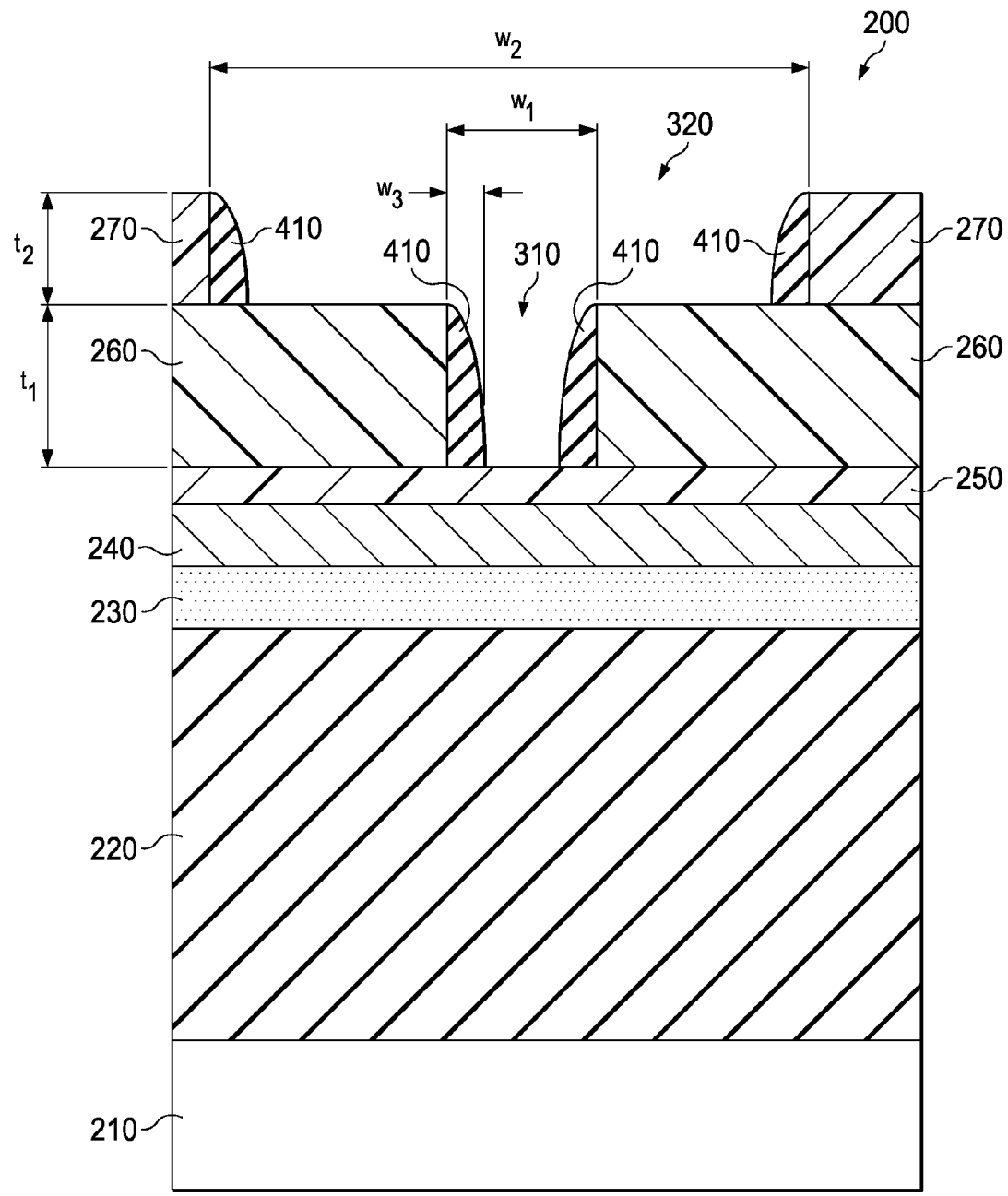

Referring to FIGS. 1 and 4, the method 100 proceeds to step 106 by forming spacers 410 along sidewalls of the first opening 310 and the second opening 320. The spacers 410 may be formed by depositing a spacer layer over the first and second openings, 310 and 320, and followed by a spacer etch to etch the spacer layer anisotropically. The spacer layer may include silicon oxide, silicon nitride, oxynitride, silicon carbide, titanium oxide, titanium nitride, tantalum oxide, tantalum nitride, or any suitable materials. The spacer layer may be deposited by ALD, CVD, PVD, or other suitable techniques. In one embodiment, the spacer layer is deposited by ALD to achieve conformable film coverage along the sidewalls. In one embodiment, the spacer layer includes a material which is different from the second interlayer 240 and the third interlayer 250 to achieve etching selectivity subsequent etches. By controlling the thickness of the spacer layer, the spacers 410 are formed to have a third width $w_3$. In one embodiment, the third width $w_3$ is in a range of about 20 nm-60 nm.

Figure 5:
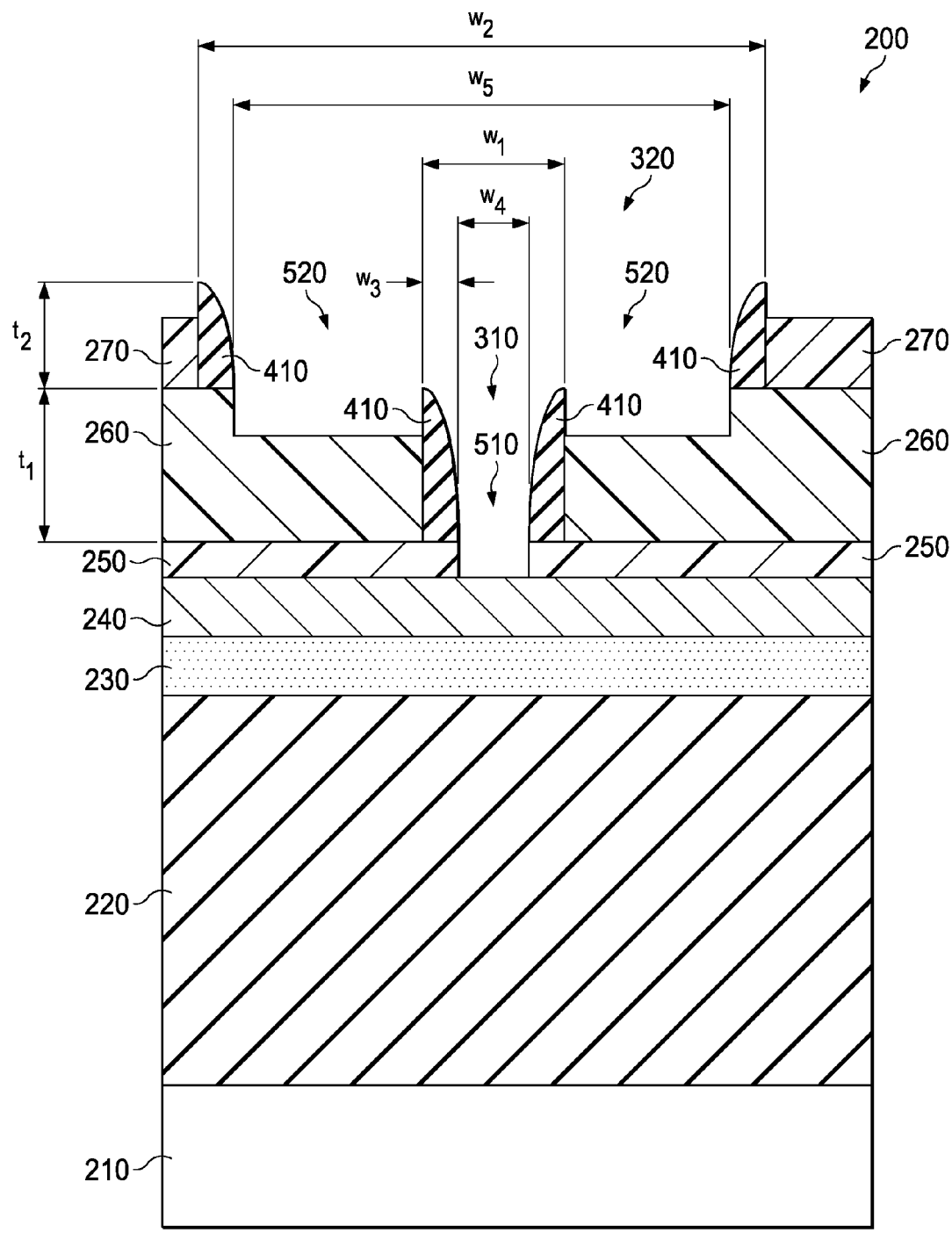

Referring to FIGS. 1 and 5, the method 100 proceeds to step 108 by applying a first etch process, using the spacer 410 as an etch mask. The first etch process etches the third interlayer 250, using spacers 410 along the first opening 310 as an etch mask, to form a first trench 510 in the third interlayer 250 and removes a first portion of the first photoresist layer 260, using the spacers 410 along the second opening 320 as an etch mask, to form a second trench 520 in the first photoresist layer 260. The second interlayer 240 is exposed in the first trench 510. A portion of the second photoresist layer 270, outside the second opening 320, is removed as well. The etch process is properly chosen to selectively remove the third interlayer 250 and the photoresist layers, 260 and 270, but does not substantially etch the spacers 410 and the second interlayer 240. In the present embodiment, the etch process includes an anisotropic etch. For example, the etch process is a plasma anisotropic etch. Therefore, both of the first and the second trenches, 510 and 520, are formed with vertical profiles. As has been mentioned previously, with an adequate etch selectivity, the second interlayer 240 serves as an etch stop layer, which improves etch process window and trench profile control.

By using spacers 410 as the etch mask, a width of the first trench 510, a fourth width $w_4$, is equal to $w_1-(2\times w_3)$ and a width of the second trench 520, a fifth width $w_5$, is equal to $w_2-(2\times w_3)$. In other words, both of the fourth width $w_4$ and the fifth width $w_5$ are reduced by $2\times w_3$, compared to the first width $w_1$ and the second width $w_2$, respectively.

Figure 6:
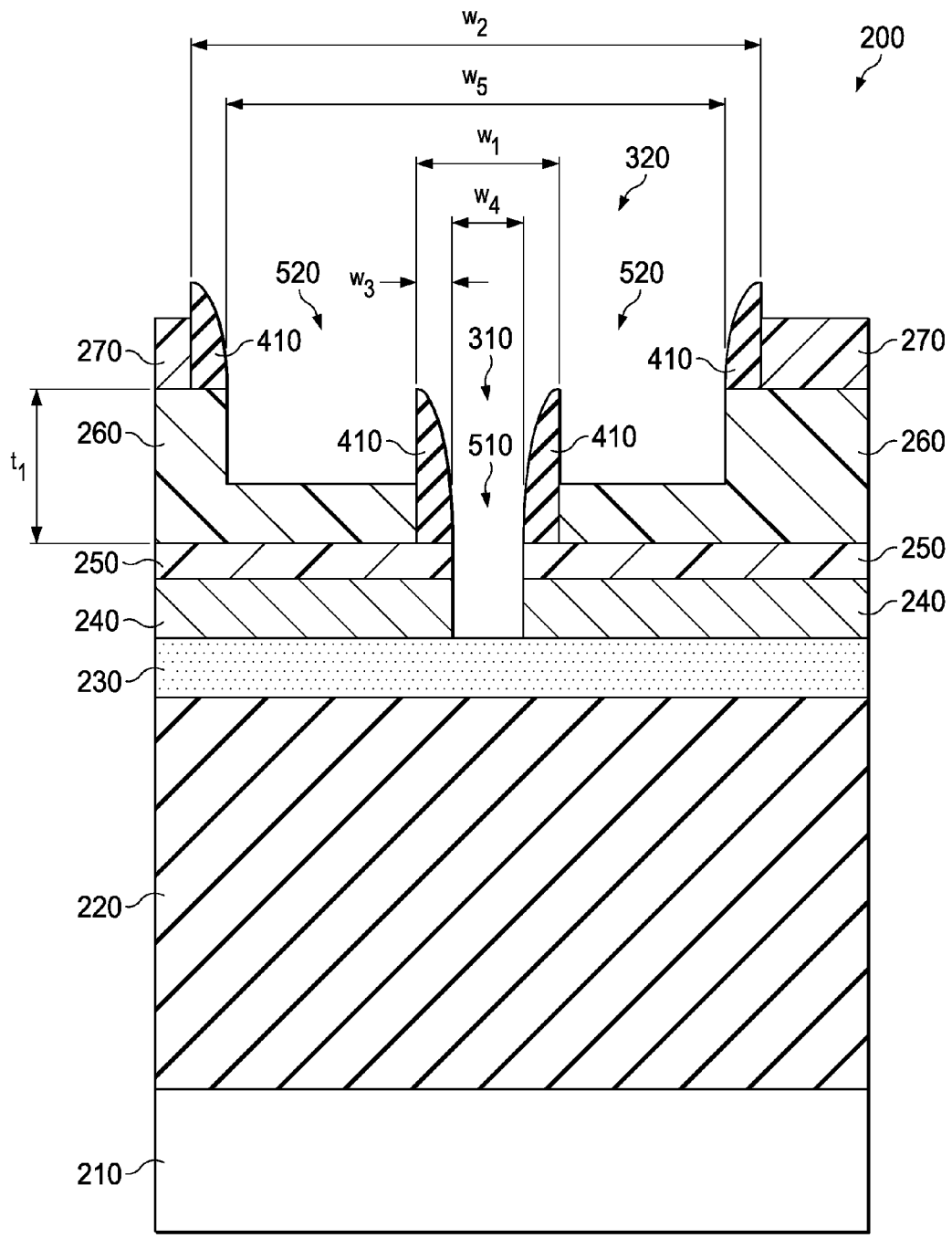

Referring to FIGS. 1 and 6, the method 100 proceeds to step 110 by using the spacer 410 as an etch mask and applying a second etch process to etch the exposed second interlayer 240 through the first trench 510 to extend the first trench 510 down to first interlayer 230. The first interlayer 230 is exposed in the extended first trench 510. In the meantime, also using the spacer 410 as the etch mask, the second etch process removes a second portion of the first photoresist layer 260 to make the second trench 520 extend deeper into the first photoresist layer 260. Another portion of the second photoresist layer 270, outside of the second opening 320, is removed as well. The second etch process is properly chosen to selectively remove the second interlayer 240 and the photoresist layers, 260 and 270, but does not substantially etch the spacers 410 and the first interlayer 230. In the present embodiment, the etch process includes an anisotropic etch, such as a plasma anisotropic etch. Therefore, the first and the second trenches, 510 and 520, are formed with vertical profiles and carry the fourth width $w_4$ and the fifth width $w_5$, respectively. As has been mentioned previously, with an adequate etch selectivity, the first interlayer 230 serves as an etch stop layer, which improves etch process window and trench profile control.

Figure 7:
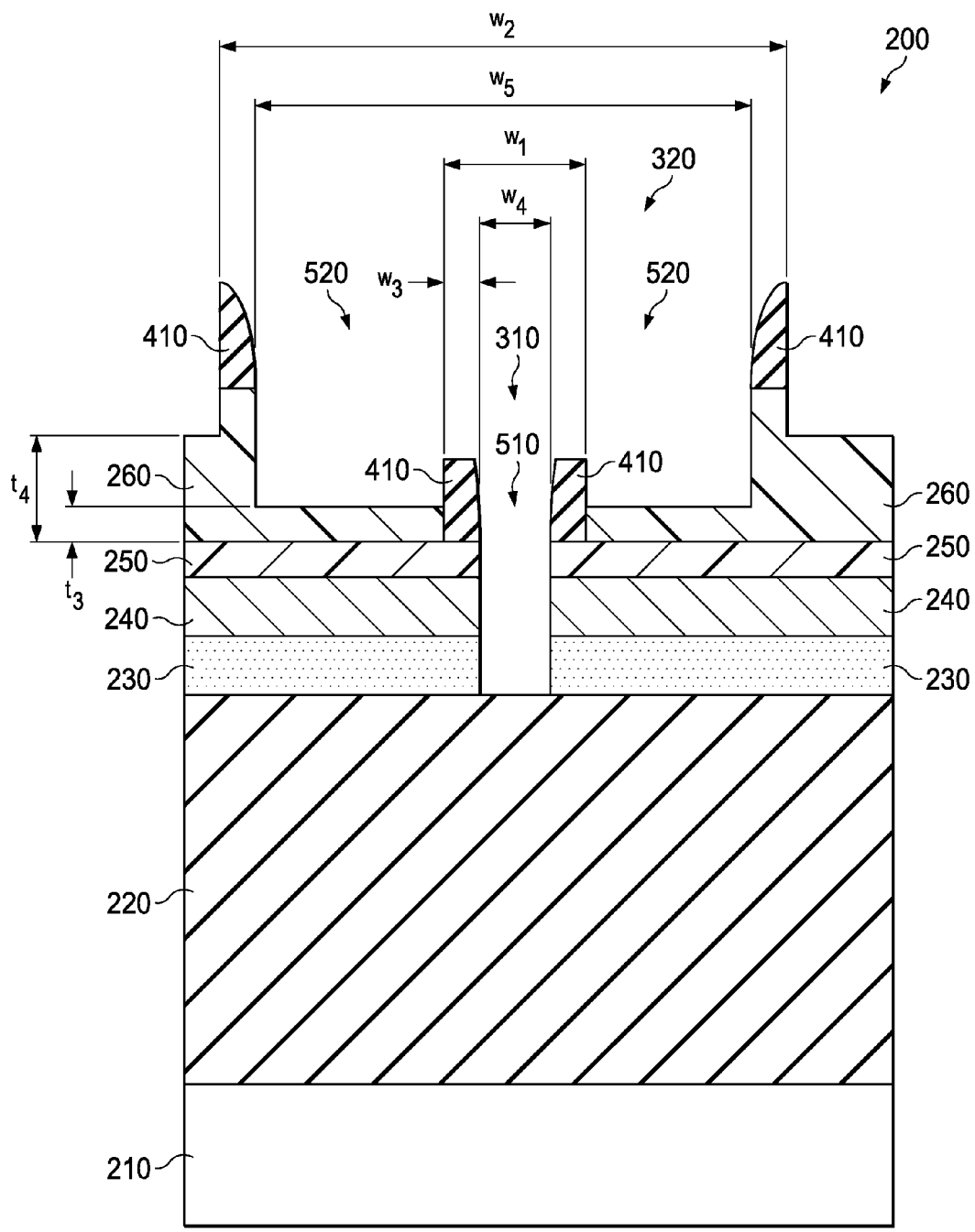

Referring to FIGS. 1 and 7, the method 100 proceeds to step 112 by applying a third etch process to etch the exposed first interlayer 230 through the first trench 510 to extend the first trench 510 down to the dielectric layer 220. In the meantime, a third portion of the first photoresist layer 260 within the second trench 520 is removed to make the second trench 520 extend deeper into the first photoresist layer 260. Another portion of the second photoresist layer 270 or the first photoresist layer 260, outside the second opening 320, is removed as well. Here, as shown in FIG. 7, the third etch process completely removes any portion of the second photoresist layer 270 that remained after performing the second etching process discussed above with respect to FIG. 6. However, in alternative embodiments, after performing the third etch process a portion of the second photoresist layer 270 may remain over first photoresist layer 260.

The third etch process is properly chosen to selectively remove the first interlayer 230, the first photoresist 260 but does not substantially etch the third interlayer 250 and the second interlayer 240. In the present embodiment, the etch process includes an anisotropic etch, such as a plasma anisotropic etch. Therefore, the extended first and the second trenches, 510 and 520, are formed continually with vertical profiles and carry the fourth width $w_4$ and the fifth width $w_5$ respectively. As has been mentioned previously, with an adequate etch selectivity, the dielectric layer 220 serves as an etch stop layer, which improves etch process window and trench profile control. Also, and as has been previously discussed, the first thickness $t_1$ and $t_2$ are designed to be adequate not only for the above etch processes in steps 108, 110 and 112, but also, after finishing the step 112, a third thickness $t_3$ of the first photoresist layer 260 remains within the second trench 520 and a fourth thickness $t_4$ of the first photoresist layer 260 (or combined with any remaining portion of the second photoresist layer 270 when not completely removed by the third etch process) remains outside of the second opening 320. In the present embodiment, the fourth thickness $t_4$ is controlled to be substantial thicker than the third thickness $t_3$ to provide a buffer for a subsequent etch process in next step.

Figure 8:
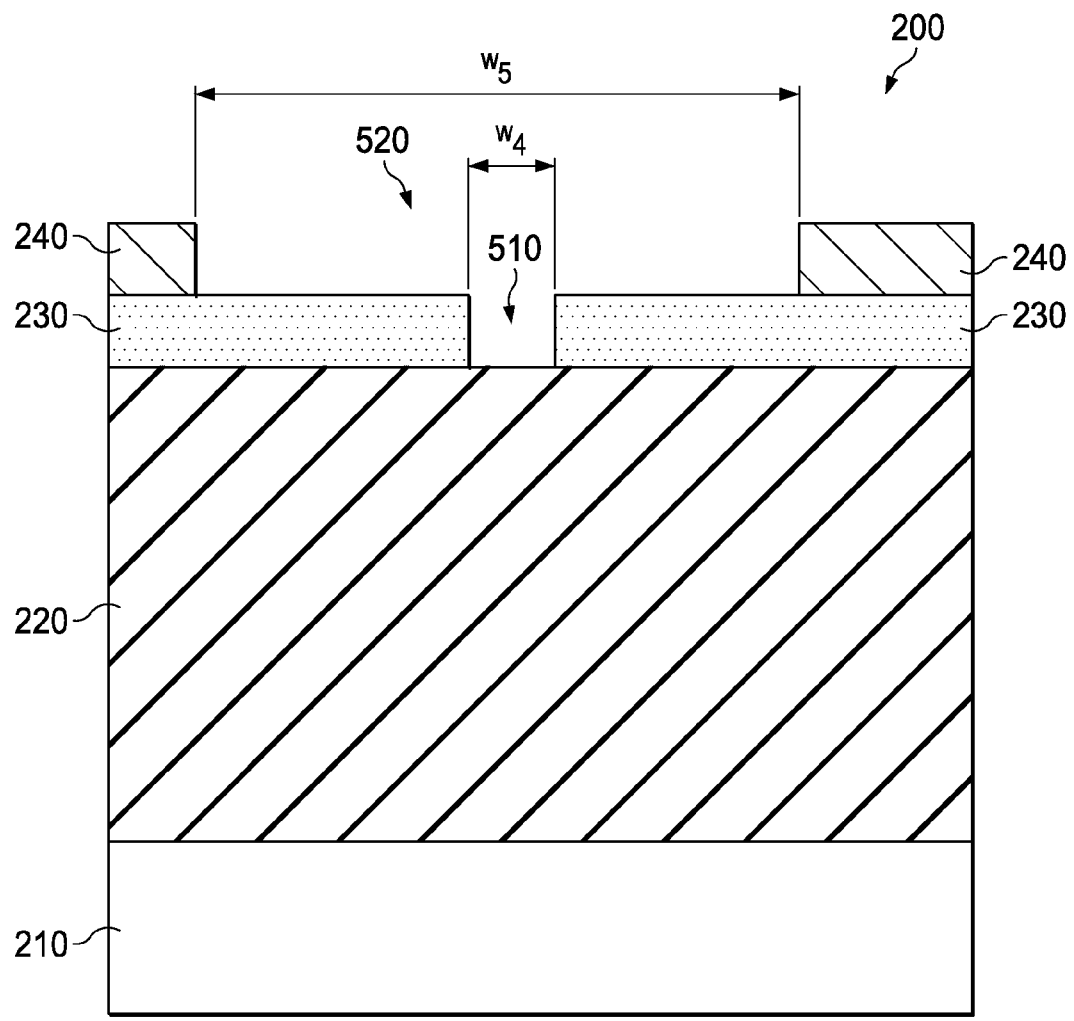

Referring to FIGS. 1 and 8, the method 100 proceeds to step 114 by applying a fourth etch process to etch the spacer 410, the first photoresist layer 260, third interlayer 250 and the second interlayer 240. The fourth etch process is properly chosen to selectively remove the spacer 410, the first photoresist layer 260, third interlayer 250 and the second interlayer 240, but does not substantially etch the first interlayer 230 and the dielectric layer 220. With an adequate thickness different between the third thickness $t_3$ and the fourth thickness $t_4$ as a buffer, the fourth etch process is controlled to remove all of the first photoresist layer 260, the third interlayer 250, the second interlayer 240 within the second trench 520 to transfer the second trench 520 to the second interlayer 240. Thereby, the first interlayer 230 carries the first trench 510 having fourth width $w_4$ and the second interlayer 240 carries the second trench 520 having fifth width $w_5$.

In one embodiment, the fourth etch process includes an anisotropic etch, such as a plasma anisotropic etch. A photoresist strip process is applied to remove any remaining photoresist layers.

Figure 9:
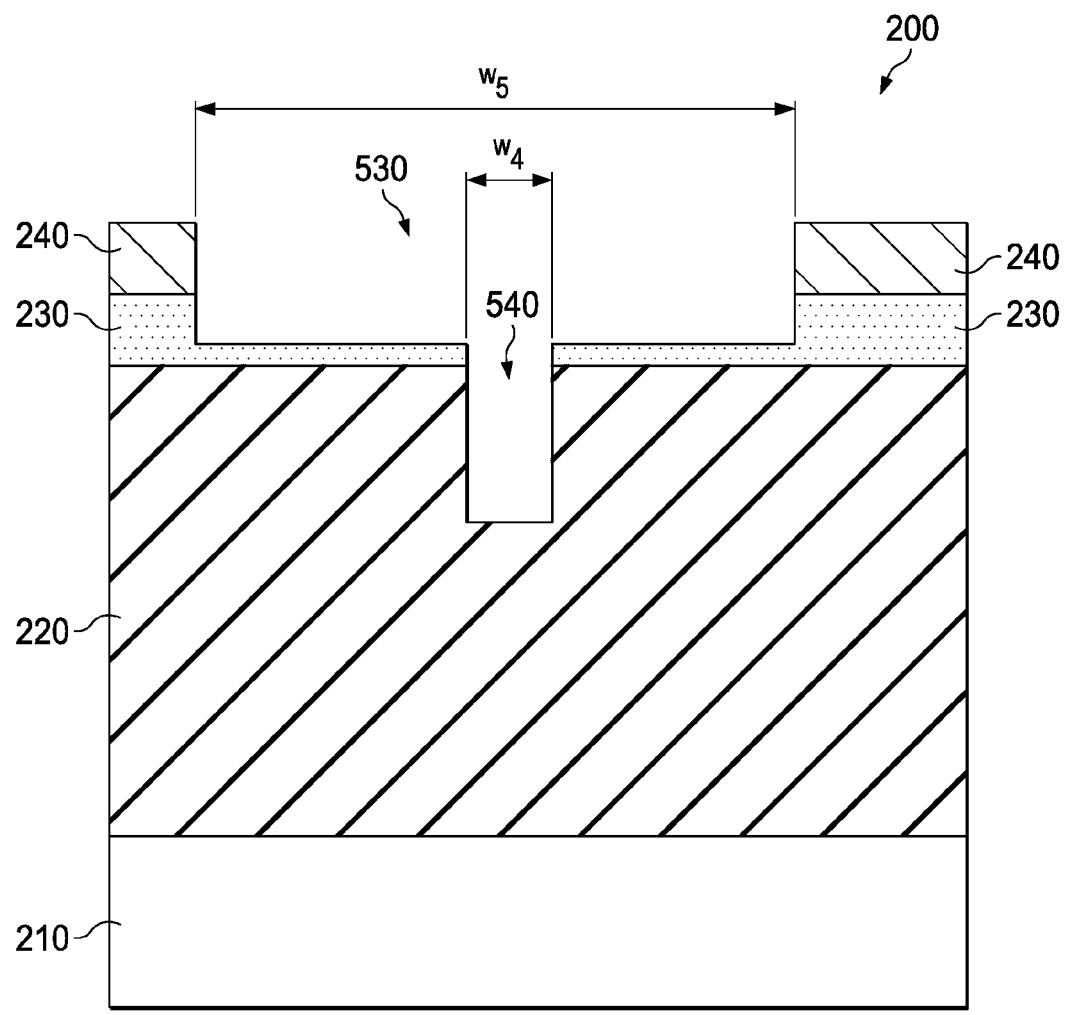

Referring to FIGS. 1 and 9, the method 100 proceeds to step 116 by applying a fifth etch process, using the second interlayer 240 as an etch mask, to etch the first interlayer 230 within the second trench 520 and form a third trench 530 in the first interlayer 230. Simultaneously the fifth etch process etches the dielectric layer 220 within the first trench 510 to form a fourth trench 540 The fifth etch process is properly chosen to etch the first interlayer 230 substantial slower compared to etching the dielectric layer 220. Thus, a remaining portion of the first interlayer 230 serves as an etch mask during etching the dielectric layer 220. For example, an etch rate of the first interlayer 230 is about 20% of an etch rate of the dielectric layer 220.

In the present embodiment, the fifth etch process includes an anisotropic etch, such as a plasma anisotropic etch. Therefore, the third and the fourth trenches, 530 and 540, are formed with vertical profiles and carry the fifth width $w_5$ and the fourth width $w_4$, respectively.

Figure 10:
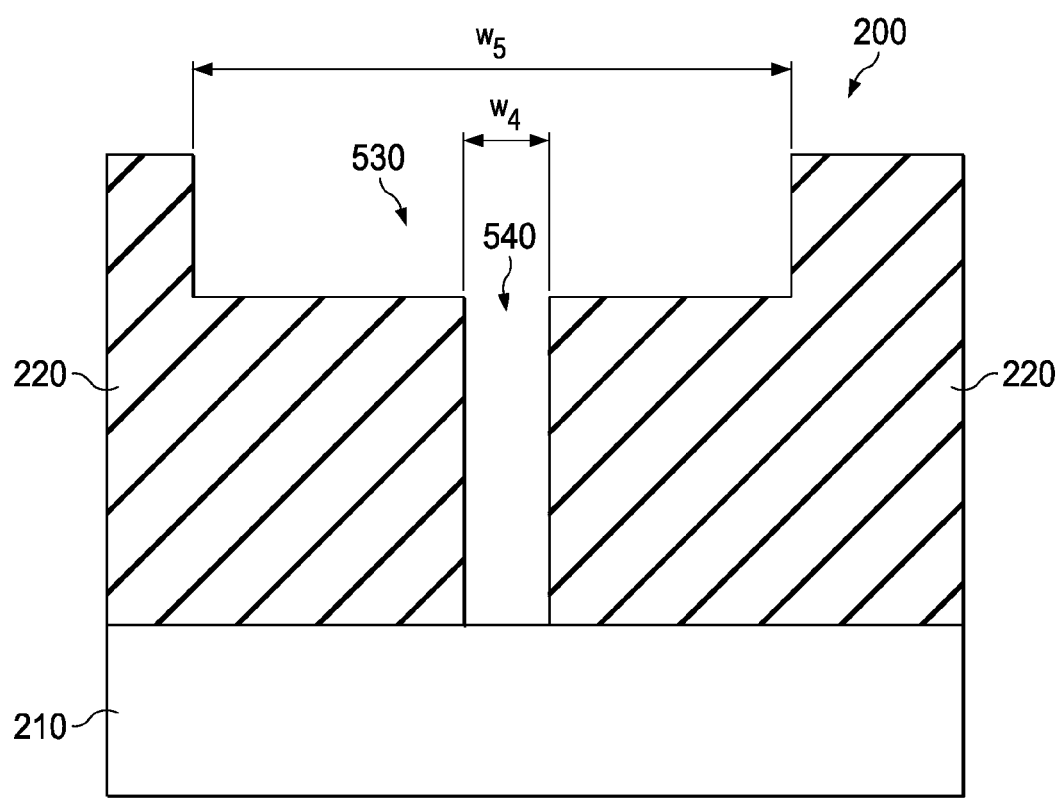

Referring to FIGS. 1 and 10, the method 100 proceeds to step 118 by applying a sixth etch process, using the second interlayer 240 as an etch mask, to etch the first interlayer 230 and the dielectric layer 220 within the third trench 530 to form an upper portion of a dielectric trench 550. Simultaneously, the sixth etch process removes the dielectric layer 220 within the fourth trench 540 to form a lower portion of the dielectric trench 550. The sixth etch process is properly chosen to selectively remove the dielectric layer 220 and the first interlayer 230 but does not substantially etch the second interlayer 240. In the present embodiment, the sixth etch process includes an anisotropic etch, such as a plasma anisotropic etch. Therefore, the dielectric trench 550 is formed with vertical profiles and carries the fifth width $w_5$ and the fourth width $w_4$, in its upper portion and lower portion, respectively. The remaining second interlayer 240 and the first interlayer 230 are then removed by another etch process.

Thereby the dielectric trench 550 includes a wider upper portion that connects with a much narrower lower portion. The upper portion carries the fifth width $w_5$ and the lower portion carries the fourth width $w_4$. In one embodiment, the substrate 210 is exposed in the dielectric trench 550. In one embodiment, the lower portion of the dielectric trench 550 serves as a via trench and the upper portion of the dielectric trench serves as a metal line trench.

Additional steps can be provided before, during, and after the method 100, and some of the steps described can be replaced, eliminated, or moved around for additional embodiments of the method 100. The device 200 may undergo further CMOS or MOS technology processing to form various features and regions. For example, a via feature and a metal line are formed by a suitable procedure. In one embodiment, a conductive material, such as metal or metal alloy, is filled in the third trench 530 and the fourth trench 540 by deposition, such as physical vapor deposition (PVD). A chemical mechanical polishing (CMP) process is applied to remove excessive conductive material and to planarize the top surface.

Based on the above, the present disclosure offers methods for fabricating IC device. The method employs applying multiple etch processes on multiple film layers by managing etch selectivity among those film layers. The method also employs forming spacers as an etch mask to reduce a size of feature to be formed. The method demonstrates forming a trench with two different sizes for its lower portion and its upper portion by one lithography process and multiple etch processes. The method also demonstrates to form the trench with a much smaller width than a width made by the lithography process.

The present disclosure provides many different embodiments of fabricating an IC that provide one or more improvements over other existing approaches. In one embodiment, a method for fabricating an IC includes forming a dielectric layer over a substrate, forming an interlayer over the dielectric layer, forming a first photoresist (PR) layer over the dielectric layer, forming a second PR layer over the first PR layer, patterning the first and second PR layers to form a first opening in the second PR layer and a second opening in the first PR layer. The patterning the first and second PR layers includes performing a single exposure process to the first and second PR layers to form a first latent feature and a second latent feature in the first and second PR layers, respectively, and performing a development process to form the first and second openings by removing the second and first latent features, respectively. The method also includes forming spacers along opposing sidewalls of the second opening, performing a first etching process to the interlayer to form a first trench extending through the first etched interlayer while using the spacers along the second opening as an etch mask, the first trench having a first width. The method also includes performing a second etching process to the first etched interlayer to form a second trench extending through the second etched interlayer and into the dielectric layer and performing a third etching process to the second etched interlayer to form a dielectric trench in the dielectric layer that includes an upper portion having a second width and a lower portion having the first width that is different than the second width.

In another embodiment, a method for fabricating an IC includes providing a substrate. The substrate includes forming a dielectric layer over a substrate, forming an interlayer over the dielectric layer, forming a first photoresist (PR) layer over the dielectric layer, forming a second PR layer over the first PR layer, forming a first opening in the second PR layer and the second opening in the first PR layer by performing a single exposure process, forming spacers along opposing sidewalls of the first and second openings, performing a first etching process to the interlayer to form a first trench extending through the first etched interlayer while using the spacers along the second opening as an etch mask, performing the first etching process to the first PR layer to form a second trench while using the spacers along the first opening as an etch mask, performing a second etching process to the first etched interlayer to form a third trench extending through the second etched interlayer and into the dielectric layer, performing the second etching process to the first etched PR layer to form a fourth trench extending through the first etched the first PR layer and into the interlayer, performing a third etching process to the second etched dielectric layer and the second etched interlayer to form a dielectric trench in the dielectric layer that includes an upper portion having a second width and a lower portion having a first width that is different than the second width.

In yet another embodiment, a method for fabricating a semiconductor IC includes forming a dielectric layer over a substrate, forming a first photoresist (PR) layer with a first opening over the dielectric layer, forming a second PR layer with a second opening over the first PR Layer. The first and second PR layers received a single exposure process. The method also includes forming spacers along opposing sidewalls of the first and second openings, forming a lower portion of a dielectric trench in the dielectric layer while using the spacer along the first opening as an etch mask and forming an upper portion of the dielectric trench in the dielectric layer while using the spacer along the second opening as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising: providing a substrate having a first layer and a second layer; patterning the first and second layers to form first and second openings, respectively, wherein the patterning utilizes a single exposure process; forming spacers along opposing sidewalls of the second opening; performing a first etching process to the second layer to form a first trench extending through the second layer while using the spacers along the second opening as a mask, the first trench having a first width; and performing a second process to the first etched second layer to form a second trench extending through the second layer and into the first layer.

2. The method of claim 1, further comprising:
performing a third process to the second layer to form a third trench in the first layer that includes an upper portion having a second width and a lower portion having the first width that is different than the second width.

3. The method of claim 2, wherein the second and third processes each include etching.

4. The method of claim 3, wherein the first process does not substantially etch the first layer.

5. The method of claim 2, wherein the first and second layers are adjacent.

6. The method of claim 5, wherein the first layer is a dielectric layer.

7. The method of claim 5, wherein the second layer includes three sub-layers.

8. The method of claim 5, wherein the second layer includes an interlayer.

9. The method of claim 2, wherein the second width is formed to be larger than the first width.

10. The method of claim 2, wherein the lower portion of the substrate trench is formed with a vertical profile.

11. The method of claim 2, wherein the first layer includes a low-k dielectric material.

12. The method of claim 1, wherein forming spacer includes:
depositing a spacer layer by atomic layer deposition (ALD); and
anisotropically etching the spacer layer.

13. The method of claim 12, wherein the spacer is formed with a width in a range of about 10 nm to 40 nm.

14. A method for fabricating a semiconductor integrated circuit (IC), the method comprising:
providing a substrate having a first layer and a second layer;
forming a first patterning layer over the first layer;
forming a second patterning layer over the first patterning layer;
forming a first opening in the second patterning layer and a second opening in the first patterning layer by performing a single exposure process;
forming spacers along opposing sidewalls of the first and second openings;
performing a first etching process to the second layer to form a first trench extending through the first etched second layer while using the spacers along the second opening as an etch mask;
performing the first etching process to the first patterning layer to form a second trench while using the spacers along the first opening as an etch mask;
performing a second etching process to the first etched second layer to form a third trench extending through the second etched second layer and into the first layer; and
performing the second etching process to the first etched patterning layer to form a fourth trench extending through the first etched the first patterning layer and into the second layer.

15. The method of claim 14 further comprising:
performing a third etching process to the second etched first layer and the second etched second layer to form a dielectric trench in the first layer that includes an upper portion having a second width and a lower portion having a first width that is different than the second width.

16. The method of claim 15, wherein the forming the spacer includes:
depositing a spacer layer by atomic layer deposition (ALD); and
anisotropically etching the spacer layer, wherein the spacer has a width in a range of about 10 nm to about 40 nm.

17. The method of claim 15, wherein the second width is formed to be larger than the first width.

18. The method of claim 17, wherein the forming the spacer includes:
depositing a spacer layer by atomic layer deposition (ALD); and
anisotropically etching the spacer layer;
wherein the spacer is formed with a width in a range of about 10 nm to about 40 nm.

19. The method of claim 14, wherein the first trench is formed by a selective etching, which does not substantially etch the first layer.

20. A method for fabricating a semiconductor integrated circuit (IC), the method comprising:
forming a first layer over a substrate;
forming a first patterning layer with a first opening over the first layer;
forming a second patterning layer with a second opening over the first patterning layer, wherein the first and second patterning layers received a single exposure process;
forming spacers along opposing sidewalls of the first and second openings;
forming a lower portion of a dielectric trench in the first layer while using the spacer along the first opening as an etch mask; and
forming an upper portion of the dielectric trench in the first layer while using the spacer along the second opening as an etch mask.

* * * * *